United States Patent
Minixhofer et al.

(10) Patent No.: US 7,319,251 B2
(45) Date of Patent: Jan. 15, 2008

(54) BIPOLAR TRANSISTOR

(75) Inventors: Rainer Minixhofer, Unterpremstatten (AT); Georg Roehrer, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/547,059

(22) PCT Filed: Dec. 16, 2003

(86) PCT No.: PCT/EP03/14339

§ 371 (c)(1),
(2), (4) Date: Aug. 25, 2005

(87) PCT Pub. No.: WO2004/077571

PCT Pub. Date: Sep. 10, 2004

(65) Prior Publication Data
US 2006/0060942 A1    Mar. 23, 2006

(30) Foreign Application Priority Data
Feb. 28, 2003 (DE) .............................. 103 08 870

(51) Int. Cl.
*H01L 29/739* (2006.01)
(52) U.S. Cl. .................... 257/197; 438/235; 438/309
(58) Field of Classification Search ................ 257/197; 438/235, 309
See application file for complete search history.

(56) References Cited

U.S. PATENT DOCUMENTS

| 4,135,954 A | 1/1979 | Chang et al. |
| 5,144,398 A * | 9/1992 | Morishita ............... 257/51 |
| 5,338,416 A | 8/1994 | Mlcak et al. |
| 5,343,064 A | 8/1994 | Spangler et al. |
| 5,648,294 A | 7/1997 | Bayraktaroglu |
| 6,114,745 A * | 9/2000 | Fang et al. ............... 257/588 |
| 6,362,065 B1 | 3/2002 | Swanson et al. |
| 6,642,553 B1 * | 11/2003 | Drews et al. ............. 257/197 |

FOREIGN PATENT DOCUMENTS

| DE | 19845789 | 3/2000 |
| DE | 10104776 | 8/2002 |
| EP | 0000327 | 1/1979 |
| EP | 0375965 | 7/1990 |
| EP | 0740351 | 10/1996 |
| JP | 02001933 | 1/1990 |

OTHER PUBLICATIONS

Translation of International Preliminary Examination Report for Application No. PCT/EP2003/014339.
Behammer et al., "Low Temperature Ultra-Scalled fully self-aligned transistor technology (LOTUS) for SiGe-HBTs," High speed semiconductor devices and circuits, 1995, pp. 142-151, ISBN: 0-7803-2442-0, XP010154225.
"Selective Germanium-etch Emitter Opening," IBM Bulletin, Bd. 35, Nr. 3, Aug. 1, 1992, pp. 428-431, ISSN: 0018-8689, XP000326331.
German Examination Report for DE 103 08 870.9.

* cited by examiner

*Primary Examiner*—Douglas M. Menz
(74) *Attorney, Agent, or Firm*—Fish & Richardson P.C.

(57) ABSTRACT

A bipolar transistor formed in a substrate includes a collector, a base layer above the collector, where the base layer includes a base that is monocrystalline, and an emitter layer that is monocrystalline and above the base, where the emitter layer includes silicon or silicon-germanium. An intermediate layer is above the base layer and below the emitter layer. The intermediate layer includes silicon carbide. The intermediate layer is grown epitaxially and is etchable in a dry plasma relative to the emitter layer.

11 Claims, 3 Drawing Sheets

BIPOLAR TRANSISTOR

TECHNICAL FIELD

The invention pertains to a bipolar transistor with a substrate, in which a collector is realized, wherein a base layer is arranged above the collector and the base is realized in a monocrystalline fashion in the base layer, and wherein an emitter layer that is also realized in a monocrystalline fashion is arranged above the base.

Bipolar transistors designed in this fashion are used as high-speed transistors. This is achieved due to the high-quality monocrystalline structure of the base and the emitter, both of which are respectively deposited epitaxially. This makes it possible to realize the junctions between the collector and the base and, in particular, between the base and the emitter in such a way that the typical boundary surface problems occurring at these locations are minimized. In addition, an epitaxial base can be realized relatively thin such that the width of the base can be reduced and high switching speeds of the transistor can be achieved.

BACKGROUND

Non-monocrystalline emitters, e.g., of polysilicon, have the disadvantage that their doping usually requires an implantation step or an in-situ doping step during the deposition, as well as a subsequent tempering process, in order to drive the dopant into a monocrystalline region. The disadvantages are caused by the significant heat supply into the transistor layer system that leads to a widening of the intrinsic (active) base, to an increased point defect diffusion and similar effects. This results in a widened base profile and limits the maximum attainable switching speed of the transistor that is defined by the transit time required by the charge carriers in order to cross the base. In addition, a highly doped emitter-base junction with a high emitter-base capacitance and a low breakdown voltage of the junction is achieved in this fashion. However, the polycrystalline structure of the emitter also manifests itself in the surface and affects the smoothness of the emitter-base junction due to its geometric structure, wherein diffusion effects of the dopant used for the emitter are observed, in particular, on the grain boundaries.

Two different methods are generally employed for manufacturing a bipolar transistor with an epitaxial base and an epitaxial emitter layer. According to the first method, a base layer is grown epitaxially and an insulating layer is subsequently produced thereon and structured in order to expose the intrinsic base. The emitter layer can then be epitaxially deposited thereon. The disadvantage of this method can be seen in that the time-consuming epitaxy needs to be carried out in an epitaxy reactor and interrupted after the base layer is produced. Once the insulating layer is produced and structured accordingly, the wafer needs to be placed back into the reactor and the epitaxy conditions need to be restored. This additionally increases the expenditure of time. When the window in the insulating layer is opened, the unprotected intrinsic base is also subjected to the etching medium used. This may result in damages to the surface structure or the doping of the base.

In the second method, the base layer consists of a silicon-germanium alloy and is grown epitaxially. If a silicon layer is epitaxially grown directly thereon, the silicon-germanium alloy of the base layer may serve as an etching barrier during the subsequent structuring of the emitter layer. The disadvantage of this method can be seen in that the surface of the base layer needs to have a high germanium content of approximately 20% in order to achieve a high etching selectivity relative to silicon. However, it was determined that such high germanium concentrations at the base-emitter junction are not advantageous with respect to high switching speeds. Despite the high etching selectivity relative to silicon, the base layer may become damaged during the structuring of the emitter layer in the exposed surface regions of the base.

SUMMARY

The present invention is based on the objective of disclosing a bipolar transistor with a high-quality emitter-base junction, in which the above-described disadvantages are eliminated.

According to the invention, this objective is attained with a bipolar transistor with the characteristics of claim 1. Advantageous embodiments and a method for manufacturing a bipolar transistor according to the invention are disclosed in the remaining claims.

According to the invention, an intermediate layer is grown epitaxially above the base and underneath the emitter layer, wherein this intermediate layer can be selectively etched relative to the emitter layer. The intermediate layer makes it possible to easily realize a bipolar transistor with a fully functional emitter-base junction, namely without the emitter and the base being in direct contact with one another. The intermediate layer also provides the advantage that the emitter layer can be structured without affecting or damaging the base. The etching selectivity of the intermediate layer relative to the emitter layer consequently makes it possible to utilize the intermediate layer as an etching barrier during the structuring of the emitter layer.

The bipolar transistor according to the invention also provides the advantage that the layers for the base and the emitter that are grown epitaxially, as well as the intermediate layer situated in between, are arranged directly on top of one another such that the epitaxy steps for growing these layers can be carried out successively in the same epitaxy reactor without having to remove the substrates from the reactor. This significantly shortens the manufacturing time such that the manufacture of the product, i.e., the bipolar transistor, is less expensive than that of conventional bipolar transistors. The intermediate layer according to the invention also makes it possible to select the materials for the emitter layer and the base independently of one another. One characteristic that distinguishes the invention from transistors according to the state of the art is that the material used for the base layer is not subject to any restrictions or marginal conditions. Only the selection of the intermediate layer is subject to restrictions, namely because the intermediate layer needs to be selected in dependence on the material of the emitter layer in order to ensure that the emitter layer can be selectively etched relative to the intermediate layer.

The invention also makes it possible to achieve a dimensionally accurate definition of the emitter-base junction because the precise arrangement and size of the emitter are defined due to the direct structuring of the emitter layer. Consequently, the junction can be defined with the same high accuracy as the structuring step. This is advantageous, in particular, in comparison with the indirect definition method of the emitter-base junction known from the state of the art, in which the size of the active base that corresponds to the surface of the emitter-base junction is defined by the window in an insulating layer. The additional layer used in this known embodiment also results in increased boundary surface effects that can lead to additional interferences at the junction between the emitter and the base.

In another embodiment, the bipolar transistor according to the invention is limited by a spacer region around the structured emitter layer, wherein the spacer region lies on the base layer and laterally adjoins the emitter layer. The large-surface base layer, in which the active base is realized, has a higher dopant concentration than the (active) base in the regions that are not limited by the emitter layer or the spacer region that limits the emitter layer. This means that the surface region of the base layer that has a higher dopant concentration can be used as a base terminal or extrinsic base. Due to its high dopant concentration, this surface region has an adequate conductivity and therefore makes it possible to realize a low-resistance terminal for the active base.

The spacer region also ensures that the distance between the extrinsic base with high dopant concentration and the intrinsic (active) base with low dopant concentration is automatically adjusted. In the generally known production of a spacer region that laterally limits the structure, an auxiliary layer applied such that it covers the edges is etched back in an anisotropic fashion. The width of the spacer region parallel to the substrate plane is defined by the thickness of the auxiliary layer applied such that it covers the edges. The thickness of this auxiliary layer and therefore the distance between the extrinsic and the intrinsic base can be precisely adjusted with the aid of a suitable deposition method.

The intermediate layer is preferably realized thin in comparison with the layer thickness of the base. It comprises an electrically conductive or at least semiconductive material without affecting the emitter-base junction in any way.

Silicon carbide is one suitable material that fulfills all requirements of the intermediate layer according to the invention. This material is semiconductive, can be grown epitaxially and has a sufficient etching selectivity relative to conventional emitter layer materials, e.g., silicon or silicon-germanium. Investigations showed that a silicon carbide layer has no negative effects whatsoever on the characteristics of the emitter-base junction.

In another embodiment of the invention, the emitter layer is produced in two stages or realized in the form of a double layer, respectively. Analogous to the above-described embodiment, a thin layer is initially grown epitaxially and subsequently reinforced by depositing a polycrystalline material.

The doping of both partial layers that form the emitter layer is carried out in-situ during the application, namely with approximately identical dopant concentrations for both partial layers. It is also preferred to utilize the same material for both partial layers, preferably silicon.

The epitaxy step is the most time-consuming step, i.e., the step that essentially determines the cost. It is advantageous that an emitter layer divided into two partial layers in this fashion can be produced much faster and therefore more cost-efficiently. Since the total layer thickness of the emitter layer is relatively large in comparison with that of the base, the partial layer that is grown epitaxially should be as thin as possible in comparison with total thickness of the emitter layer so as to shorten the epitaxy process. A partial layer of polycrystalline material can be applied much easier and faster. As in the first embodiment, this two-part emitter layer also provides the advantage of a high-quality emitter-base junction that is not subjected to any interferences, for example, due to grain boundary effects. Since the polycrystalline layer can also be doped in-situ during the application, it is not necessary to carry out any tempering steps that could create or intensify boundary surface effects or defects or lead to undesirable changes of doping profiles.

The transistor according to the invention is preferably realized in the form of a npn bipolar transistor. This means that the base layer is p-doped. However, it would also be conceivable to realize the transistor in the form of a pnp bipolar transistor.

Although the different semiconductor materials for the individual layers of the transistor can be chosen independently of one another, it is preferred that the semiconductor materials comprise silicon, namely in the form of pure silicon or a semiconductor material that contains additional semiconductors in different concentrations. For example, it is possible that at least the emitter, the collector or the base layer consists of silicon that contains up to approximately 30% (by atoms) germanium. Since germanium has a different band gap than silicon, the semiconductive characteristics can be adjusted to the desired value by choosing the content of the other semiconductor and, in particular, the germanium content accordingly. The silicon may also contain up to 1% carbon. It would even be conceivable that the functional transistor layer region, particularly the base, consists of different layers with varying contents of germanium or carbon.

The method according to the invention for manufacturing such a bipolar transistor is described in greater detail below with reference to embodiments that are illustrated in the figures. The figures are not drawn true-to-scale in order to provide a better overview and schematically show various stages of the manufacture of the bipolar transistor according to the invention in the form of cross sections.

DESCRIPTION

Figure 1A:
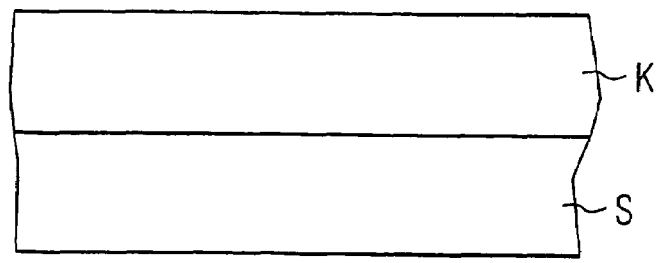
FIG. 1 shows two options for realizing a collector in a substrate.
Figure 1B:
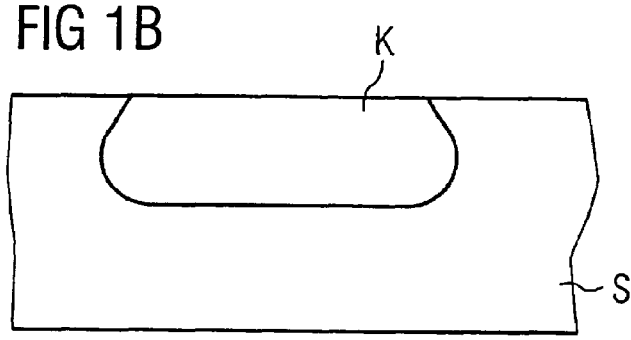

FIG. 1: The bipolar transistor according to the invention is preferably produced on a substrate S in the form of a p-type silicon wafer. The collector K can be produced in the surface of the wafer, for example, by diffusing a corresponding dopant of a first conductivity type (in this case a n-dopant) into the surface of the wafer. FIG. 1*b* shows such a collector K that was produced by doping a substrate S. It is also possible to grow an additional epitaxial layer on the substrate S in order to realize the collector K. This substrate is at least monocrystalline, preferably semiconductive, and realized in the form of, in particular, a silicon wafer. The epitaxial layer for the collector (see FIG. 1a) preferably has a low concentration of the dopant of the first conductivity type (in this case a n-dopant), but may also be built up opposite to the substrate doping. A buried n+-doped layer (not illustrated in the figure) may also be produced for the collector K in FIG. 1a underneath the epitaxial layer, for example, by means of an implantation into the substrate S before the collector K is grown epitaxially. This buried layer can be enlarged after the collector layer K is grown.

Figure 2A:
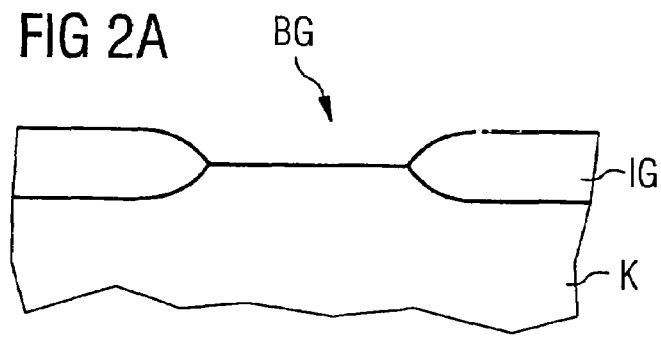
FIG. 2 shows two different options for defining the base region with the aid of insulating regions.
Figure 2B:
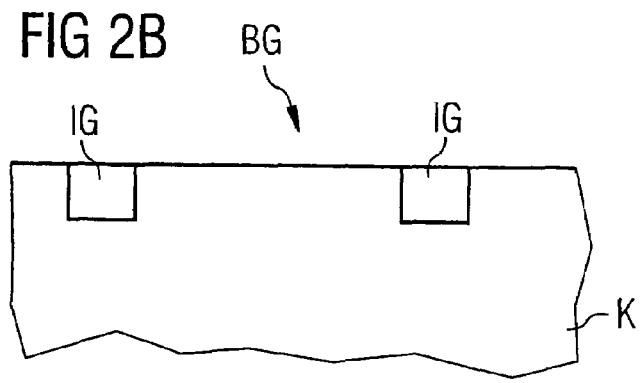

FIG. 2: Insulating regions IG are produced in the wafer around the base region BG in order to insulate the base region that is chosen larger than the actual active transistor surface (emitter-base junction). These insulating regions may be realized, for example, in the form of field oxide layers (Locos) as illustrated in FIG. 2a. It would also be possible to realize the insulating regions IG in the form of so-called Shallow Trench Insulation (STI) or deep trenches. In order to minimize the substrate surface required for the component, the base region BG is defined with a minimal diameter that is approximately identical or only slightly larger than the smallest structure size that can be produced with the respectively employed process, particularly lithography. In bipolar transistors suitable for use in high-speed applications, the base region has a vertical thickness, for example, between 150 and 400 Å.

After the definition of the base region, a base layer BS is applied over the entire surface under epitaxial conditions. Depending on the underlayer, the base layer BS grows in monocrystalline fashion above the base region BG and in polycrystalline modification above the insulating regions IG.

Figure 3:
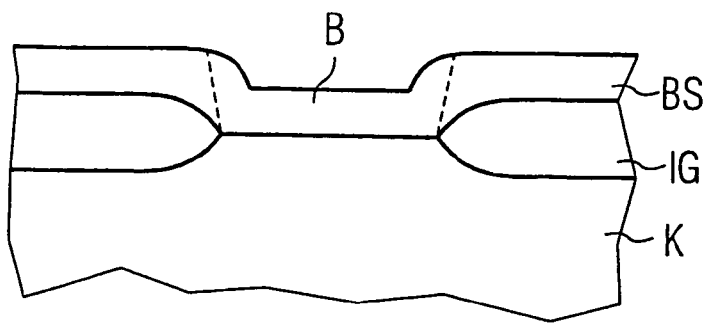
FIG. 3 shows the arrangement after the production of the base layer.

FIG. 3 shows a schematic cross section through the arrangement after growing the base layer. The base layer is realized as thin as possible for the intended application and has a thickness of no less than approximately 100 Å. However, it would also be possible, in principle, to produce higher base layers with a thickness between 300 and 500 Å. The doping of the second conductivity type, in this case a p-doping, is carried out in-situ during the growing process. The base layer is preferably grown by means of a low-temperature PE-CVD (Plasma Enhanced CVD) method or an LP-CVD (Low Pressure CVD) method. The base layer preferably consists of pure silicon. However, it would also be conceivable to utilize a silicon-germanium alloy, in which the germanium content may be as high as 30%. The semiconductive characteristics can be adjusted with the aid of the second semiconductor material that has a different band gap than silicon, namely by adjusting its content and, for example, concentration profile over the area of the base layer accordingly. For example, it is advantageous to adjust a germanium concentration gradient in silicon that has its highest concentration of, for example, 20% by atoms directly above the collector K and decreases to 0 toward the surface of the base layer.

An intermediate layer is grown in the next step, namely under the same epitaxial conditions as those used for growing the base layer BS. A preferred intermediate layer consists of silicon carbide. The intermediate layer is grown to a thickness that lies substantially below that of the base layer, for example, at approximately 30 to 150 Å. The intermediate layer is grown in the same reactor as the base layer, namely without having to remove the wafer or substrate from the reactor.

The emitter layer ES is grown in the same reactor immediately after the intermediate layer ZS. In this case, it is preferred to grow a relatively thick silicon layer that is doped in-situ with a dopant of the second conductivity type, namely a n+-dopant in the embodiment shown. The emitter layer ES is substantially thicker than the base layer, in particular, so as to provide a thickness reserve during the subsequent opening of a window for producing the emitter contacts. This layer as well as the preceding epitaxial layers are grown at the lowest temperature possible, for example, at approximately 800° C. Although the quality of the layers increases at lower growing temperatures, the growing speed decreases proportionally.

Figure 4:
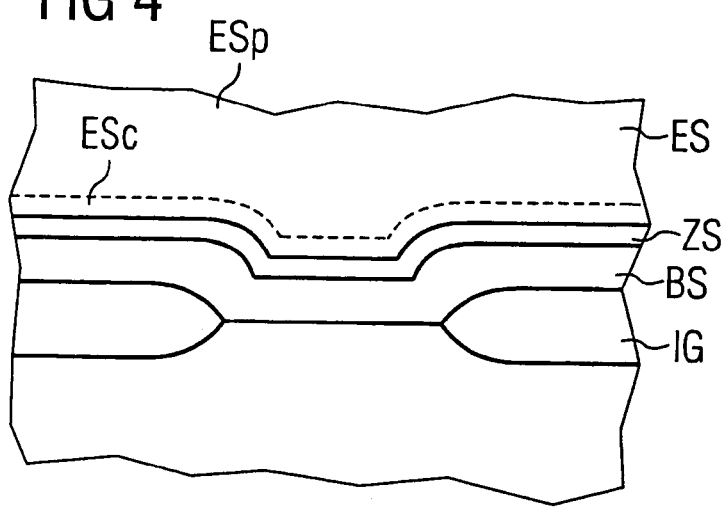
FIG. 4 shows the arrangement after the production of the emitter layer.

FIG. 4 shows the arrangement after the production of the emitter layer ES. A broken line in the lower portion of the emitter layer ES indicates that this layer may also consist of two partial layers. The thinner first partial layer $ES_C$ is applied in epitaxial fashion while a comparatively thicker second partial layer $ES_p$ is applied in polycrystalline modification. The polycrystalline partial layer $ES_p$ can also be grown in the same reactor. This merely requires an adaptation of the growth conditions.

Subsequently, a hard mask HM that preferably consists of an insulating material is applied over the entire surface of the emitter layer ES. The emitter layer ES and the hard mask HM applied thereon are then structured. This is realized with a photolithography method, in which a resist mask is applied over the hard mask HM and photolithographically structured. The structuring of the hard mask HM and the emitter layer ES can be carried out in one step, namely by means of an anisotropic plasma etching method. The etching gases are chosen such that they selectively etch the semiconductor material used for the emitter layer ES, but not the intermediate layer ZS that consists, for example, of silicon carbide. The intermediate layer ZS consequently serves as an etching barrier during the structuring process and prevents the (active) base lying thereunder from being etched and damaged.

Figure 5:
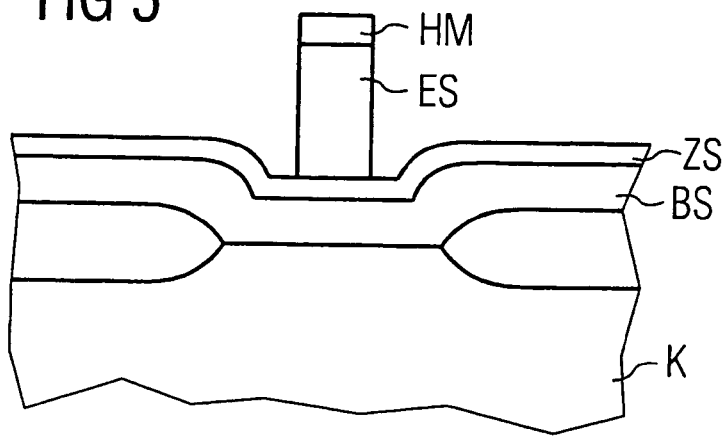
FIG. 5 shows the arrangement after the structuring of the emitter layer.

FIG. 5 shows the arrangement after this step. The structuring defines the surface of the emitter-base junction that may approximately correspond to the size of the base region or be slightly smaller. Accordingly, the emitter layer is preferably arranged in the center of the base region.

Figure 6:
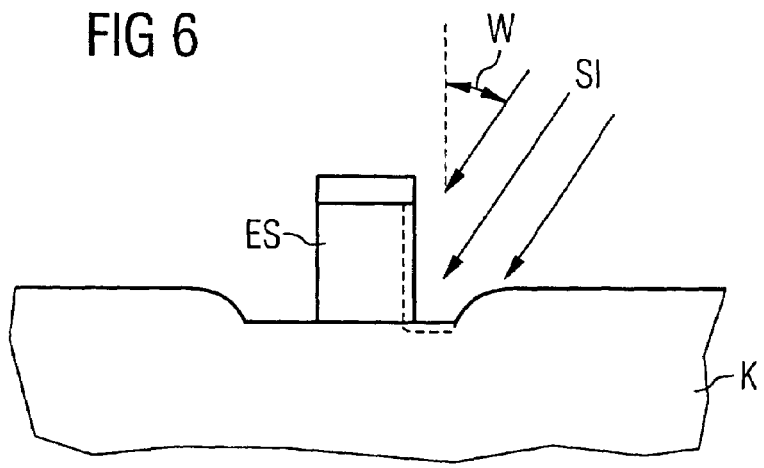
FIG. 6 shows the arrangement during an angular implantation process.

The etching process for structuring the emitter layer ES represents a potential source of defects because damages may occur in the edge regions of the emitter-base junction that are subjected to the etching medium. These damages may lead to an undesirable recombination current. This problem can be eliminated by optionally carrying out an angular implantation of a boronic dopant in this case, namely with low implantation energy. In this case, the implantation angle W relative to the normal extending perpendicular to the surface of the substrate S is greater than 7°, for example, W=45°. During the angular implantation SI that is indicated with corresponding arrows in FIG. 6, the substrate is turned such that the emitter layer ES is uniformly doped with boron from all sides. The low implantation energy only produces a boron doping near the surface, wherein this boron doping shifts the emitter-base junction away from the etched outer edges of the emitter-base boundary surface, namely inward where no etching defects can be produced during the structuring of the emitter layer. The grain defects caused by the etching process therefore have no effect on the function of the transistor.

Figure 7:
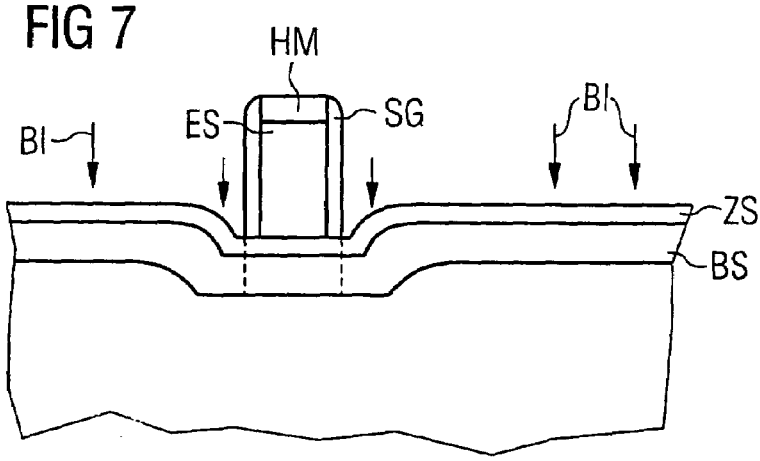
FIG. 7 shows the arrangement after the production of the spacer regions, namely during the implantation of the base layer.
Figure 8:
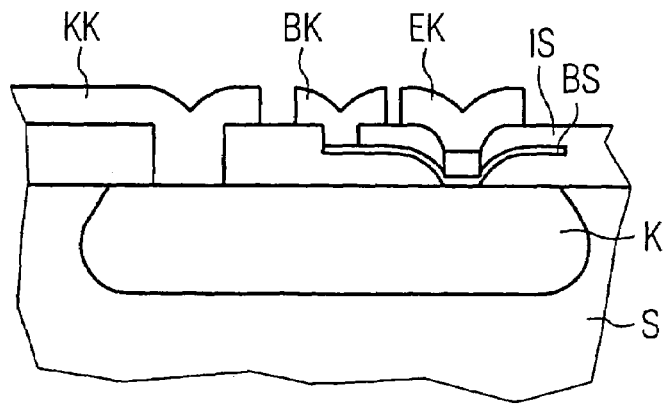
FIG. 8 shows a detail of a finished bipolar transistor.

The surface regions of the base layer that are not covered by the emitter can be used for producing the base terminal. In this respect, it is advantageous to realize the base layer such that it is more conductive and therefore less resistive in these regions by increasing the dopant concentration. In this case, it needs to be ensured that the emitter-base junction and the extrinsic base with a higher dopant concentration, i.e., the surface area of the base layer BS that has a higher dopant concentration, are spaced apart by a certain distance. This is achieved by producing spacer regions SG that surround the structured emitter. These spacer regions are typically produced in the form of an applied auxiliary layer that covers the entire surface and consists of an electrically insulating material, for example, by etching a silicon oxide layer in an anisotropic fashion. This causes the spacer regions SG to remain on the edges of all of topographic steps, namely also on the edges of the emitter layer, as long as the steps are higher than the thickness of the applied auxiliary layer that consists, in particular, of an oxide layer. The hard mask HM situated above the structured emitter layer serves for protecting the emitter layer from the etching plasma and consists of a material that can be selectively etched relative to the auxiliary layer, for example, silicon nitride. The thickness of the spacer region SG parallel to the surface of the substrate essentially corresponds to the thickness of the original auxiliary layer in this case and is chosen such that it corresponds to the desired distance between extrinsic and active base. The base implantation BI is indicated with corresponding arrows in FIG. 7 and carried out after the production of the spacer region.

The structures required for the function of the bipolar transistor are finished on this step. Additional insulating layers, for example, oxide layers, are produced over the arrangement illustrated in FIG. 7 in order to complete the component. Subsequently, windows are opened in the oxide layer in order to produce the electric terminals for emitter, base and collector. For example, the contacts consist of tungsten. The collector contact KK is produced in a window within the insulating layer IS that extends as far as the collector or into the collector K. The doping of the collector can be increased underneath the collector contact KK. The base contact BK is produced in a window within the insulating layer IS that extends as far as the surface of the intermediate layer used as the etching barrier. A window that extends as far as the surface of the emitter layer ES is produced in the insulating layer IS for the emitter contact EK. The thickness reserve of the emitter layer ensures that the layer region containing the depletion zone of the emitter-base contact remains undamaged when the window for the emitter contact EK is opened.

Since no high-temperature steps whatsoever are required in the manufacture of the bipolar transistor according to the invention, the method is best suited for the integration into a BiCMOS process. The method is self-adjusting and results in high-quality emitter-base contacts and a high-quality collector-base junction. The high quality of the junctions allows a precise adjustment of the desired characteristics and makes it possible to manufacture bipolar transistors that are faster than conventional transistors manufactured with conventional methods.

Although the invention was only described with reference to a few embodiments, it is by no means restricted to these embodiments. Variations are possible, in particular, with respect to the geometric design, all dimensional data and the material selection, particularly with respect to the materials that do not directly form part of the transistor junctions. Consequently, the majority of data cited with reference to the embodiments only has an exemplary character and can be varied accordingly for other applications.

The invention claimed is:

1. A bipolar transistor formed in a substrate, the bipolar transistor comprising:
   a collector;
   a base layer above the collector, the base layer comprising a monocrystalline base region;
   an emitter layer comprising a monocrystalline emitter layer that is above the monocrystalline base region, the emitter layer comprising silicon or silicon-germanium; and
   an intermediate layer above the monocrystalline base region and below the monocrystalline emitter layer, the intermediate layer for separating the monocrystalline base region from the monocrystalline emitter layer, the intermediate layer comprising silicon carbide, the intermediate layer being grown epitaxially and being selectively etchable in a dry plasma relative to the emitter layer.

2. The bipolar transistor of claim 1, wherein the emitter layer is structured;
   wherein a contact surface between the monocrystalline emitter layer and the monocrystalline base region defines an active emitter-base junction;
   wherein the bipolar transistor further comprises a spacer region on the base layer, the spacer region for limiting the emitter layer laterally; and
   wherein a surface region of the base layer that is not covered by the emitter layer or the spacer region has a higher dopant concentration than the monocrystalline base region.

3. The bipolar transistor of claim 1, wherein the intermediate layer is thinner than the base layer and the intermediate layer comprises a semiconductive or electrically-conductive material.

4. The bipolar transistor of claim 1, further comprising:
   a polycrystalline silicon layer above the emitter layer, the polycrystalline silicon layer having substantially a same doping as the emitter layer;
   wherein the emitter layer and the polycrystalline silicon layer form an emitter.

5. A method or manufacturing a bipolar transistor, comprising:
   forming a collector having a doping of a first conductivity type in a substrate;
   epitaxially forming a base layer having a doping of a second conductivity type above the collector, the base layer comprising a monocrystalline base region;
   epitaxially forming an intermediate layer that is selectively etchable relative to silicon, the intermediate layer being formed above the monocrystalline base region;
   epitaxially forming an emitter layer having a doping of the first conductivity type above the intermediate layer, the emitter layer comprising a monocrystalline emitter layer formed above the intermediate layer such that the intermediate layer separates the monocrystalline emitter layer from the monocrystalline base region, the intermediate layer comprising silicon or silicon-germanium; and
   structuring the emitter layer anisotropically, the intermediate layer comprising an etching barrier.

6. The method of claim 5, wherein the substrate comprises a monocrystalline semiconductor layer and the method comprises:
   forming a doped region in the substrate by implanting a dopant of the first conductivity type;
   wherein forming the collector comprises tempering the substrate so as to drive the dopant into the substrate and thereby enlarge the doped region.

7. The method of claim 6, further comprising:
   forming insulating regions that are adjacent to the collector and that border the monocrystalline base region;
   wherein the base layer comprises a monocrystalline substance.

8. The method of claim 5, wherein the intermediate layer is formed by growing silicon carbide and the emitter layer is formed by growing silicon or silicon-germanium; and wherein the method comprises structuring the emitter layer by selectively etching the emitter layer anisotropically using a dry plasma.

9. The method of claim 5, further comprising:

forming a mask layer above the emitter layer;

structuring the emitter layer with the mask layer;

applying a spacer layer that can be selectively etched relative to the mask layer over an entire surface of the emitter layer and an exposed surface of the base layer; and etching the spacer layer anisotropically until the at least part of the base layer is removed and a spacer region remains around the emitter layer.

10. The method of claim 9, further comprising:

implanting a dopant having the second conductivity type over a surface of the bipolar transistor at an implantation angle of mare than 7° relative to a normal to a surface of the substrate after structuring the emitter layer.

11. The method of claim 9, further comprising increasing doping of the base layer outside an area limited by the spacer layer by implanting a dopant of the second conductivity type.

\* \* \* \* \*